(12) United States Patent
Lim et al.

(10) Patent No.: US 12,274,108 B2
(45) Date of Patent: Apr. 8, 2025

(54) THIN FILM TRANSISTOR COMPRISING A LOW LEAD CONTENT HALIDE ANION PEROVSKITE AND DISPLAY DEVICE INCLUDING THE THIN FILM TRANSISTOR

(71) Applicants: Samsung Display Co., Ltd., Yongin-Si (KR); POSTECH Research and Business Development Foundation, Pohang-si (KR)

(72) Inventors: Jun Hyung Lim, Seoul (KR); Yong-Young Noh, Daejeon (KR); Soyoung Koo, Hwaseong-si (KR); Hyungjun Kim, Seoul (KR); Huihui Zhu, Pohang-si (KR)

(73) Assignees: SAMSUNG DISPLAY CO., LTD, Gyeonggi-Do (KR); POSTECH RESEARCH AND BUSINESS DEVELOPMENT FOUNDATION, Gyeongsangbuk-Do (KR)

( * ) Notice: Subject to any disclaimer, the term of this patent is extended or adjusted under 35 U.S.C. 154(b) by 553 days.

(21) Appl. No.: 17/537,993

(22) Filed: Nov. 30, 2021

(65) Prior Publication Data
US 2022/0310948 A1 Sep. 29, 2022

(30) Foreign Application Priority Data
Mar. 26, 2021 (KR) .................. 10-2021-0039375

(51) Int. Cl.
*H10K 10/46* (2023.01)
*H10K 59/125* (2023.01)
(Continued)

(52) U.S. Cl.
CPC ......... *H10K 10/488* (2023.02); *H10K 10/466* (2023.02); *H10K 10/484* (2023.02);
(Continued)

(58) Field of Classification Search
None
See application file for complete search history.

(56) References Cited

U.S. PATENT DOCUMENTS

| 2016/0268510 A1* | 9/2016 | Moon ............... C07F 13/00 |
| 2017/0179192 A1* | 6/2017 | Zhang ............ H01L 27/1255 |

(Continued)

FOREIGN PATENT DOCUMENTS

| JP | 2019527934 A | 10/2019 |
| KR | 101794735 B1 | 12/2017 |
| WO | 2018015831 A1 | 1/2018 |

OTHER PUBLICATIONS

Solution processed hafnium oxide as a gate insulator for low-voltage oxide thin-film transistors; Avis et al.; J. Mater. Chem., 2012,22, 17415-17420; URL: https://doi.org/10.1039/C2JM33054G (Year: 2012).*

*Primary Examiner* — Steven M Christopher
*Assistant Examiner* — Tyler J Wiegand
(74) *Attorney, Agent, or Firm* — CANTOR COLBURN LLP

(57) ABSTRACT

A thin film transistor includes a gate electrode, an insulating layer disposed on the gate electrode, and an active layer disposed on the insulating layer, where the active layer includes a perovskite compound represented by the following Formula: $AB_{(1-u)}C_{(u)}[X_{(1-v)}Y_{(v)}]_3$, where A is a monovalent organic cation, a monovalent inorganic cation, or any combination thereof, B is $Sn^{2+}$, C is a divalent cation or trivalent cation, X is a monovalent anion, Y is a monovalent anion different from X, u is a real number greater than 0 and less than 1, and v is a real number greater than 0 and less than 1.

16 Claims, 14 Drawing Sheets

(51) Int. Cl.
  *H10K 71/12*  (2023.01)
  *H10K 71/40*  (2023.01)
  *H10K 85/30*  (2023.01)
  *H10K 85/50*  (2023.01)

(52) U.S. Cl.
  CPC ........... *H10K 59/125* (2023.02); *H10K 71/12* (2023.02); *H10K 71/40* (2023.02); *H10K 85/50* (2023.02); *H10K 85/30* (2023.02)

(56) References Cited

U.S. PATENT DOCUMENTS

2020/0185630 A1   6/2020  Ke et al.
2020/0343053 A1  10/2020  Lunt et al.
2021/0143350 A1*  5/2021  Irwin ..................... H10K 30/88

* cited by examiner

THIN FILM TRANSISTOR COMPRISING A LOW LEAD CONTENT HALIDE ANION PEROVSKITE AND DISPLAY DEVICE INCLUDING THE THIN FILM TRANSISTOR

This application claims priority to Korean Patent Application No. 10-2021-0039375, filed on Mar. 26, 2021, and all the benefits accruing therefrom under 35 U.S.C. § 119, the content of which in its entirety is herein incorporated by reference.

BACKGROUND

1. Field

Embodiments of the invention relate generally to a thin film transistor, a method for manufacturing the thin film transistor, and a display device including the thin film transistor.

2. Description of the Related Art

A halide anion-based perovskite compound has high optical and electrical properties, and may be applied as a material for a light absorption layer of a solar cell and a material for an emission layer of a display device. However, the perovskite compound mainly contains lead (Pb), which is harmful to the human body. Accordingly, there is a demand for the development of perovskite compounds that mainly contain substances that are not harmful to the human body and have high photoelectric properties.

SUMMARY

Embodiments provide a thin film transistor.

Embodiments provide a method for manufacturing the thin film transistor.

Embodiments provide a display device including the thin film transistor.

In an embodiment, a thin film transistor includes a gate electrode, an insulating layer disposed on the gate electrode, and an active layer disposed on the insulating layer and comprising a perovskite compound represented by the following Formula: $AB_{(1-u)}C_{(u)}[X_{(1-v)}Y_{(v)}]_3$, where A is a monovalent organic cation, a monovalent inorganic cation, or any combination thereof, B is $Sn^{2+}$, C is a divalent cation or trivalent cation, X is a monovalent anion, Y is a monovalent anion different from X, u is a real number greater than 0 and less than 1, and v is a real number greater than 0 and less than 1.

In an embodiment, X and Y may be independent of each other and may each be selected from the group consisting of $I^-$, $Cl^-$, $Br^-$, and $SCN^-$.

In an embodiment, X may be $I^-$, and Y may be selected from the group consisting of $Cl^-$, $Br^-$, and $SCN^-$.

In an embodiment, the v may be a real number greater than 0 and less than 0.08.

In an embodiment, C may be selected from the group consisting of $Pb^{2+}$, $In^{3+}$, and $Sb^{3+}$.

In an embodiment, the u may be a real number greater than 0 and less than 0.1.

In an embodiment, the u may be 0.06

In an embodiment, A may be a methylammonium cation ($MA^+$).

In an embodiment, the insulating layer may include hafnium oxide ($HfO_2$).

In an embodiment, a method for manufacturing a thin film transistor includes preparing an active solution comprising a perovskite compound represented by the following Formula: $AB_{(1-u)}C_{(u)}[X_{(1-v)}Y_{(v)}]_3$, by mixing a precursor comprising a solvent, AX, and $BY_2$, preparing a substrate on which a gate electrode is provided, providing an insulating layer on the substrate to cover the gate electrode, and providing an active layer on the insulating layer using the active solution, where A is a monovalent organic cation, a monovalent inorganic cation, or any combination thereof, B is $Sn^{2+}$, C is a divalent cation or trivalent cation, X is a monovalent anion, Y is a monovalent anion different from X, u is a real number greater than 0 and less than 1, and v is a real number greater than 0 and less than 1.

In an embodiment, the providing the active layer may include using a spin coating process.

In an embodiment, the spin coating process may be performed at about 3000 revolutions per minute (rpm) for about 30 seconds.

In an embodiment, the providing the active layer may include using a thermal evaporation process, and the thermal evaporation process may be performed by heating the precursor from different sources.

In an embodiment, the providing the insulating layer may include using an atomic layer deposition process.

In an embodiment, the method may further include performing a plasma treatment or an ultraviolet ozone treatment on the insulating layer, after performing the atomic layer deposition process.

In an embodiment, a display device includes a substrate, a thin film transistor disposed on the substrate, and an emitting diode disposed on the thin film transistor and electrically connected to the thin film transistor. In such an embodiment, the thin film transistor includes a gate electrode, an insulating layer disposed on the gate electrode, and an active layer disposed on the insulating layer and comprising a perovskite compound represented by the following Formula: $AB_{(1-u)}C_{(u)}[X_{(1-v)}Y_{(v)}]_3$, where A is a monovalent organic cation, a monovalent inorganic cation, or any combination thereof, B is $Sn^{2+}$, C is a divalent cation or trivalent cation, X is a monovalent anion, Y is a monovalent anion different from X, u is a real number greater than 0 and less than 1, and v is a real number greater than 0 and less than 1.

In an embodiment, X and Y may be independent of each other and may each be selected from the group consisting of $I^-$, $Cl^-$, $Br^-$, and $SCN^-$.

In an embodiment, the v may be a real number greater than 0 and less than 0.08.

In an embodiment, C may be selected from the group consisting of $Pb^{2+}$, $In^{3+}$, and $Sb^{3+}$.

In an embodiment, the u may be a real number greater than 0 and less than 0.1.

In an embodiment, A may be a methylammonium cation ($MA^+$).

In embodiments of the invention, the thin film transistor may include the perovskite compound. In such embodiments, as the perovskite compound mainly includes tin (Sn), the perovskite compound may not include lead (Pb) or may include a small amount of lead (Pb). Accordingly, since the thin film transistor may not contain lead (Pb), which is harmful to the human body, or may contain a small amount of lead (Pb), the thin film transistor may be manufactured and used using an eco-friendly material. In such embodiments, as the perovskite compound includes two different anions, charge mobility and a current on/off ratio of the thin film transistor may be improved. In such embodiments, compared to a thin film transistor using a perovskite compound including only one anion, the thin film transistor of the invention may have a charge mobility of about 5 times or more, and a current on/off ratio of about 100 times or more, for example.

BRIEF DESCRIPTION OF THE DRAWINGS

The above and other features of the invention will become more apparent by describing in further detail embodiments thereof with reference to the accompanying drawings, in which.

DETAILED DESCRIPTION

Figure 1:
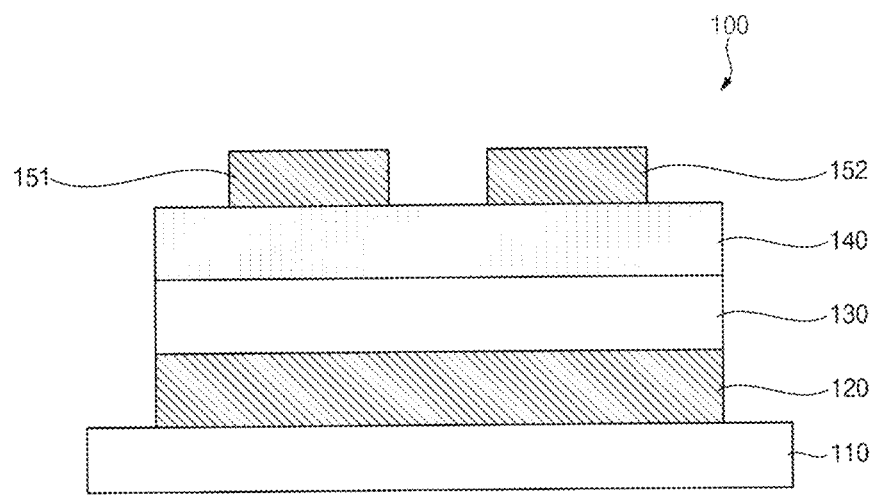
FIG. 1 is a cross-sectional view illustrating a thin film transistor according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described in detail with reference to the accompanying drawings.

Figure 2:
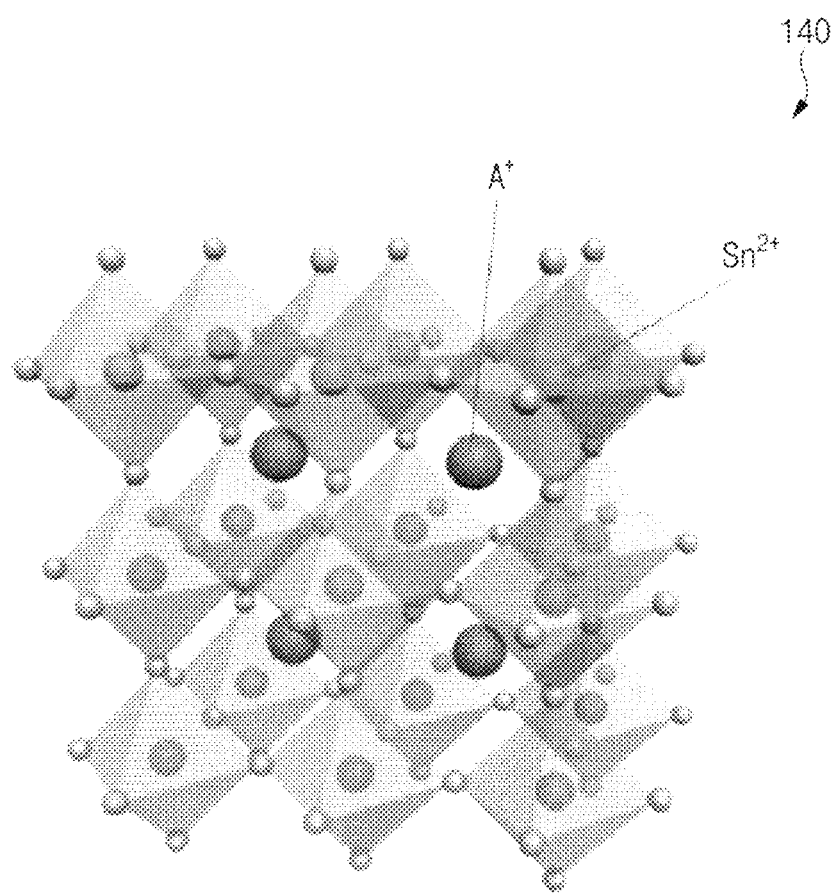
FIG. 2 is a diagram illustrating a crystal structure of a perovskite compound included in the thin film transistor of FIG. 1.
Figure 3:
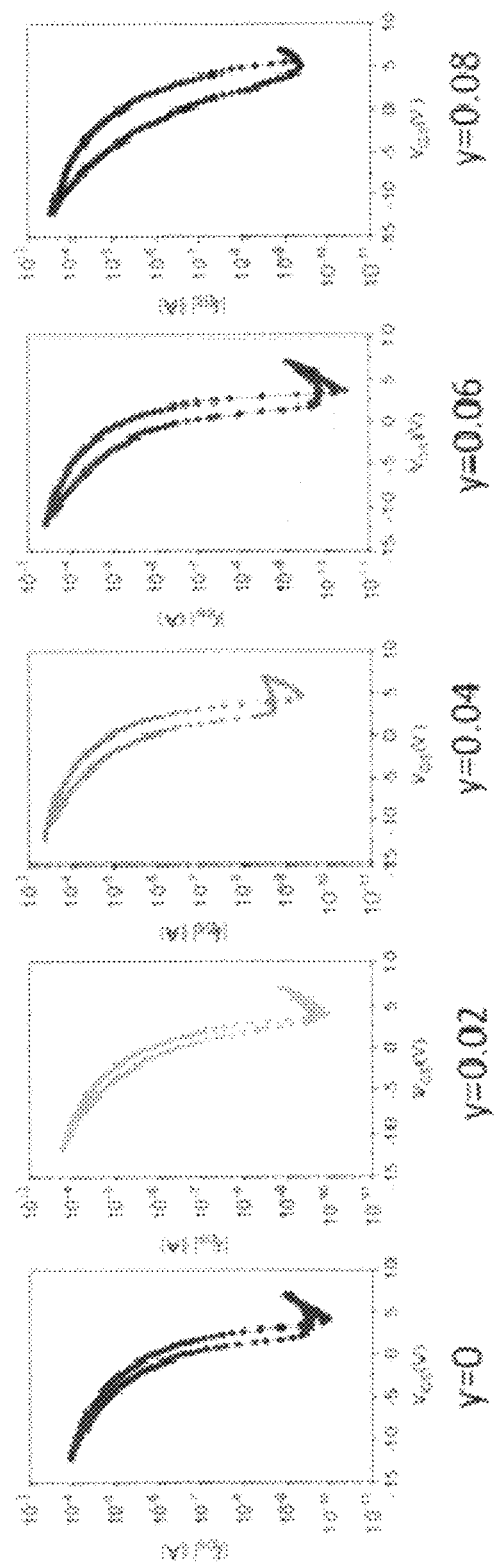
FIG. 3, FIG. 4, and FIG. 5 are graphs illustrating output curve of the thin film transistor of FIG. 1.
Figure 4:
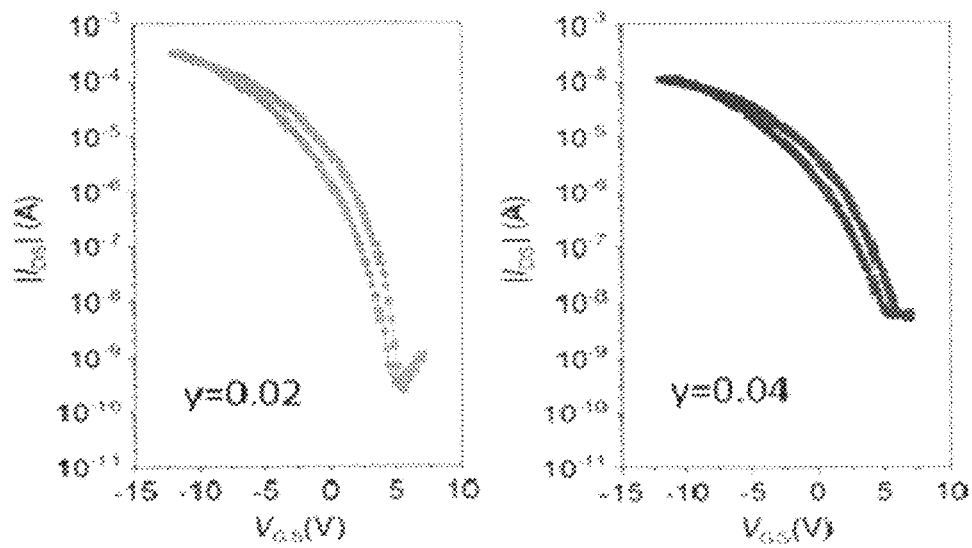
Figure 5:
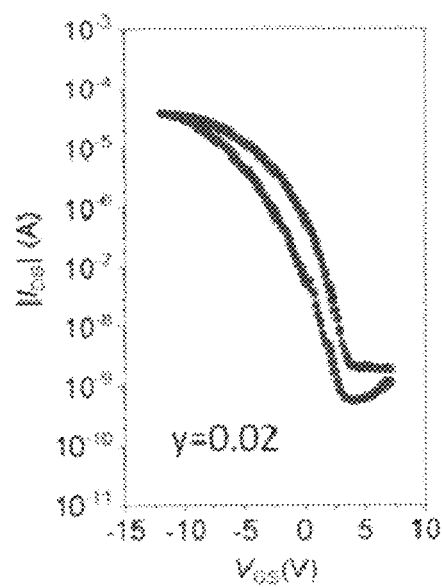

FIG. 1 is a cross-sectional view illustrating a thin film transistor according to an embodiment. FIG. 2 is a diagram illustrating a crystal structure of a perovskite compound included in the thin film transistor of FIG. 1. FIG. 3, FIG. 4, and FIG. 5 are graphs illustrating output curve of the thin film transistor of FIG. 1.

Referring to FIGS. 1 and 2, an embodiment of a thin film transistor 100 according to the invention may include a substrate 110, a gate electrode 120, an insulating layer 130, an active layer 140, a source electrode 151, and a drain electrode 152.

The substrate 110 may include a transparent or an opaque material. The substrate 110 may include at least one selected from glass, quartz, plastic, and the like. In one embodiment, for example, the substrate 110 may include at least one selected from a quartz substrate, a synthetic quartz substrate, a calcium fluoride substrate, a fluorine-doped quartz substrate, a sodalime glass substrate, a non-alkali glass substrate, a polyimide substrate, and the like. In an embodiment where the substrate 110 is the polyimide substrate, the substrate 110 may have a structure in which at least one organic film layer and at least one barrier layer are alternately stacked one on another.

The gate electrode 120 may be disposed on the substrate 110. The gate electrode 120 may include at least one selected from a metal, an alloy, a conductive metal oxide, a transparent conductive material, and the like. In one embodiment, for example, the gate electrode 120 may include at least one selected from silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt) scandium (Sc), indium tin oxide ("ITO"), indium zinc oxide ("IZO"), and the like.

The insulating layer 130 may be disposed on the gate electrode 120. The insulating layer 130 may include at least one selected from silicon oxide (SiOx), silicon nitride (SiNx), silicon oxynitride (SiON), aluminum nitride (AlN), aluminum oxide ($Al_2O_3$), hafnium oxide ($HfO_2$), yttrium oxide ($Y_2O_3$), titanium dioxide ($TiO_2$), and the like. The insulating layer 130 may effectively prevent an electrical short between the gate electrode 120 and the active layer 140.

The active layer 140 may be disposed on the insulating layer 130. In an embodiment, as shown in FIG. 2, the active layer 140 may include a perovskite compound based on tin (Sn). In one embodiment, for example, the perovskite compound may not contain lead (Pb) or may contain a small amount of lead (Pb). In such an embodiment, the perovskite compound may have a three-dimensional structure. In one embodiment, for example, the perovskite compound may have a crystal structure in which a face-centered cubic ("FCC") and a body-centered cubic ("BCC") are combined. In an embodiment, the perovskite compound may include at least two different anionic elements.

The perovskite compound may be represented by the following formula 1 below.

$$AB_{(1-u)}C_{(u)}[X_{(1-v)}Y_{(v)}]_3 \qquad \text{[Formula 1]}$$

In Formula 1, A may be a monovalent organic cation, a monovalent inorganic cation, or any combination thereof. In one embodiment, for example, A may be $(CH_3NH_3)^+$, $(C_2H_6PH_2)^+$, $(CH_3AsH_3)^+$, $(NH_4)^+$, $(CH_3SbH_3)^+$, $(C_2H_6NH_2)^+$, $(PH_4)^+$, $(CH_2N_2H_4)^+$, $(PF_4)^+$, $(CH_3PH_3)^+$, $(C_7H_7)^+$, $(SbH_4)^+$, $(AsH_4)^+$, $(NCl_4)^+$, $(NH_3OH)^+$, $(NH_3NH_2)^+$, $(CH(NH_2)_2)^+$, $(C_3N_2H_5)^+$, $((CH_3)_2NH_2)^+$, $(NC_4H_8)^+$, $((CH_3CH_2)NH_3)^+$, $((NH_2)_3C)^+$, $Li^+$, $Na^+$, $K^+$, $Rb^+$, $Cs^+$, $Fr^+$, or any combination thereof.

In Formula 1, B may be $Sn^{2+}$.

In Formula 1, C may be a divalent cation or a trivalent cation. In one embodiment, for example, C may be $La^{2+}$, $Ce^{2+}$, $Pr^{2+}$, $Nd^{2+}$, $Pm^{2+}$, $Eu^{2+}$, $Gd^{2+}$, $Tb^{2+}$, $Ho^{2+}$, $Er^{2+}$, $Tm^{2+}$, $Yb^{2+}$, $Lu^{2+}$, $Be^{2+}$, $Mg^{2+}$, $Ca^{2+}$, $Sr^{2+}$, $Ba^{2+}$, $Ra^{2+}$, $Pb^{2+}$, $Sn^{2+}$, $Pb^{2+}$, $Sn$, $Sb^{3+}$, $Al^{3+}$, $Ga^{3+}$, $Bi^{3+}$, or any combination thereof.

In Formula 1, X may be a monovalent anion, and Y may be a monovalent anion different from X. X and Y may be independent of each other, and may be selected from the group consisting of $I^-$, $Cl^-$, $Br^-$ and $SCN^-$. In one embodiment, for example, X may be $I^-$, and Y may be selected from the group consisting of $Cl^-$, $Br^-$, and $SCN^-$.

In Formula 1, u may be a real number greater than 0 and less than 1. In an embodiment, u may be less than 0.5, and thus, the perovskite compound may mainly include $Sn^{2+}$.

In Formula 1, v may be a real number greater than 0 and less than 1. In an embodiment, v may be a real number greater than 0 and less than 0.08.

In an embodiment, the perovskite compound may be $MA_{1.04}Sn_{0.94}Pb_{0.06}(I_{(1-v)}Cl_v)_3$, and v may be greater than 0 and less than 0.08. FIG. 3 illustrates an output curve of an embodiment of the thin film transistor including the perovskite compound having the formula $MA_{1.04}Sn_{0.94}Pb_{0.06}(I_{(1-v)}Cl_v)_3$, where v is 0, 0.02, 0.04, 0.06, and 0.08.

In an embodiment, the perovskite compound may be $MA_{1.04}Sn_{0.94}Pb_{0.06}(I_{(1-v)}Br_v)_3$, and v may be greater than 0 and less than 0.04. FIG. 4 illustrates an output curve of an embodiment of the thin film transistor including the perovskite compound having the formula $MA_{1.04}Sn_{0.94}Pb_{0.06}(I_{(1-v)}Br_v)_3$, where v is 0.02 and 0.04.

In an embodiment, the perovskite compound may be $MA_{1.04}Sn_{0.94}Pb_{0.06}(I_{(1-v)}SCN_v)_3$, and v may be greater than 0 and less than 0.02. FIG. 5 illustrates an output curve of an embodiment of the thin film transistor including the perovskite compound having the formula $MA_{1.04}Sn_{0.94}Pb_{0.06}(I_{(1-v)}SCN_v)_3$, where v is 0.02.

The source electrode 151 and the drain electrode 152 may be disposed on the active layer 140. In an embodiment, the source electrode 151 and the drain electrode 152 may contact the active layer 140. The source electrode 151 and the drain electrode 152 may include at least one selected from a metal, an alloy, a conductive metal oxide, a transparent conductive material, and the like.

Figure 6:
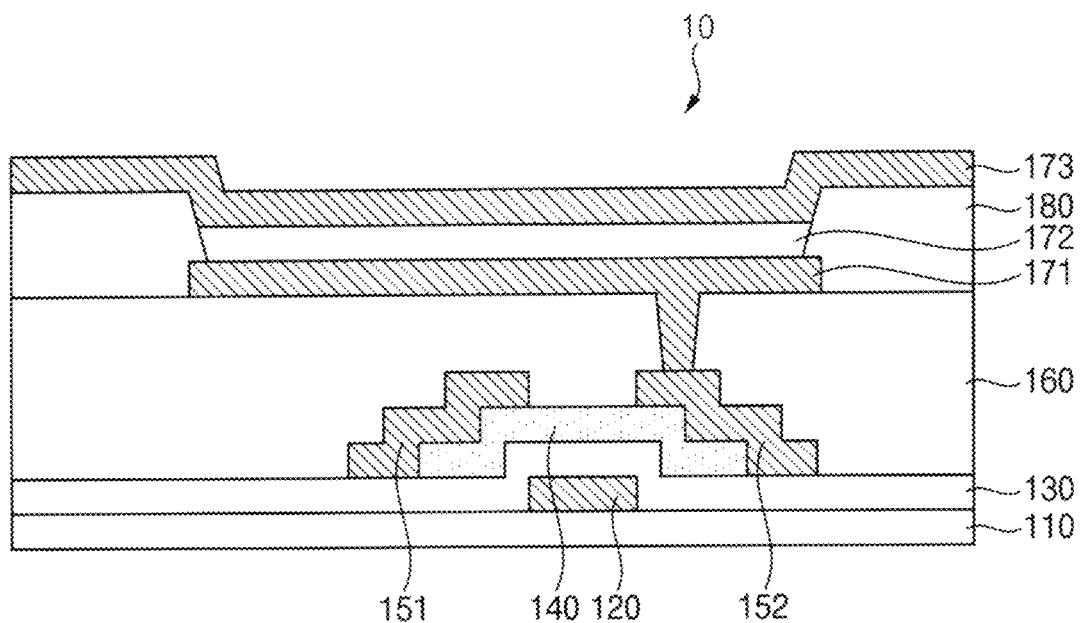
FIG. 6 is a cross-sectional view illustrating an embodiment of a display device including the thin film transistor of FIG. 1.

FIG. 6 is a cross-sectional view illustrating an embodiment of a display device including the thin film transistor of FIG. 1.

Referring to FIG. 6, an embodiment of a display device 10 including the thin film transistor 100 may include the substrate 110, the gate electrode 120, the insulating layer 130, the active layer 140, the source electrode 151, the drain electrode 152, a via insulating layer 160, a first electrode 171, a pixel defining layer 180, an emission layer 172, and a second electrode 173.

The via insulating layer 160 may cover the source electrode 151 and the drain electrode 152, and may be disposed on the insulating layer 130. The via insulating layer 160 may include an organic insulating material. In one embodiment, for example, the via insulating layer 160 may include at least one selected from a photoresist, a polyacrylic resin, a polyimide-based resin, an acrylic resin, and the like. In such an embodiment, the via insulating layer 160 may have a substantially flat top surface.

The first electrode 171 may be disposed on the via insulating layer 160. In an embodiment, the first electrode 171 may contact the drain electrode 152. The first electrode 171 may include a reflective metal material or a transparent metal material. In one embodiment, for example, the first electrode 171 may include at least one selected from silver (Ag), an alloy containing silver, molybdenum (Mo), an alloy containing molybdenum, aluminum (Al), an alloy containing aluminum, or aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), ITO, IZO, and the like.

The pixel defining layer 180 may cover the first electrode 171 and may be disposed on the via insulating layer 160. The pixel defining layer 180 may include an organic material. An opening exposing the first electrode 171 may be defined or formed in the pixel defining layer 180.

The emission layer 172 may be disposed on the first electrode 171. In one embodiment, for example, the emission layer 172 may be disposed in the opening. The emission layer 172 may generate light based on a current. In an embodiment, the emission layer 172 may include a functional layer (e.g., a hole injection layer, a hole transport layer, an electron transport layer, an electron injection layer, etc.) to increase the luminous efficiency of the emission layer 172.

The second electrode 173 may be disposed on the emission layer 172. The second electrode 173 may be in a plate shape and may include a reflective metal material or a transparent metal material.

An embodiment of the thin film transistor 100 according to the invention may include the perovskite compound represented by Formula 1 above. In such an embodiment, as the perovskite compound mainly includes tin (Sn), the perovskite compound may not include lead (Pb) or may include a small amount. Accordingly, the thin film transistor 100 may not contain lead (Pb), which is harmful to the human body, or may contain a small amount of lead (Pb), and may be manufactured and used using an eco-friendly material.

In an embodiment, as the perovskite compound includes two different anions, charge mobility and a current on/off ratio of the thin film transistor 100 may be improved. In an embodiment of the invention, the thin film transistor 100 may have a charge mobility of about 5 times or more, and a current on/off ratio of about 100 times or more, compared to a thin film transistor using a perovskite compound including only one anion.

FIG. 7 to FIG. 10 are cross-sectional views illustrating an embodiment of a method for manufacturing the display device of FIG. 6.

Figure 7:
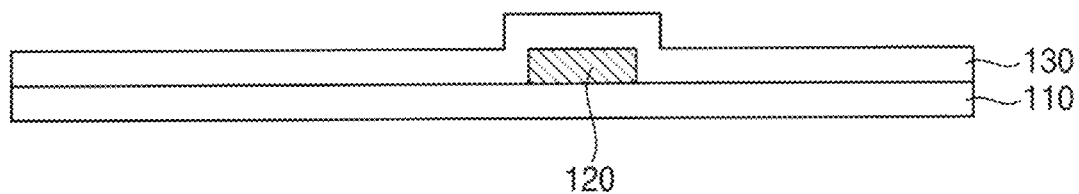
FIG. 7 to FIG. 10 are cross-sectional views illustrating an embodiment of a method for manufacturing the display device of FIG. 6.

Referring to FIG. 7, the gate electrode 120 may be provided or formed on the substrate 110, and the insulating layer 130 may be provided or formed on the substrate 11o to cover the gate electrode 120. In an embodiment, the insulating layer 130 may be formed through at least one process selected from an atomic layer deposition ("ALD") process, a pulse laser deposition process ("PLD"), a thermal evaporation process, a molecular beam epitaxy ("MBE"), a sputtering, a chemical vapor deposition ("CVD"), and a plasma enhanced chemical vapor deposition ("PECVD"). In one embodiment, for example, the insulating layer 130 may be formed through the atomic layer deposition process. In such an embodiment, after the atomic layer deposition process is performed, the insulating layer 130 may be subjected to plasma treatment or ultraviolet ("UV") ozone treatment. Accordingly, the hydrophilicity of the insulating layer 130 may be improved.

Figure 8:
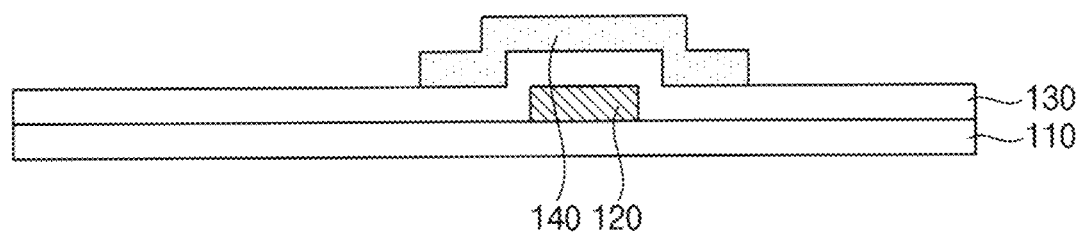

Referring to FIG. 8, the active layer 140 may be provided or formed on the insulating layer 130. In an embodiment, the active layer 140 may be formed through at least one process selected from a spin coating process, a thermal evaporation process, a drop casting process, a dip coating process, a bar coating process, a slot coating process, a dispensing process, an e-beam evaporation process, a printing process, a soft lithography process, and a sputtering.

In an embodiment, the active layer 140 may be formed through the spin coating process using an active solution. In such an embodiment, the spin coating process may be performed at about 3000 revolutions per minute (rpm) for about 30 seconds. In such an embodiment, after the spin coating process is performed, an annealing process may be performed at about 70 degrees Celsius for about 10 minutes. In an alternative embodiment, the active layer 140 may be formed through the thermal evaporation process. In such an embodiment, the thermal evaporation process may be performed by thermally depositing at least one precursor from different sources under high vacuum.

The active solution may be prepared by mixing a solvent, AX, and $BY_2$ precursor. In one embodiment, for example, the active solution may be formed by mixing a first solution with a second solution.

The first solution may be a solution in which the perovskite compound is dissolved in a protic solvent, and the second solution may be a solution in which an alkyl halide surfactant is dissolved in an aprotic solvent. The protic solvent may include at least one selected from dimethylformamide, gamma butyrolactone, N-methylpyrrolidone, dimethylsulfoxide, and the like. In such an embodiment, as described above, AX may be MAI, and $BY_2$ may be $SnCl_2$ or $SnBr_2$. However, the active solution may further include $PbCl_2$, $PbBr_2$, and the like, and the weight of the solute may be set based on the thickness of the active layer 140 to be formed. The aprotic solvent may include at least one selected from dimethylformamide, dimethylsulfoxide, dichloroethylene, trichloroethylene, chloroform, chlorobenzene, dichlorobenzene, styrene, xylene, toluene, cyclohexene, isopropyl alcohol, and the like. The alkyl halide surfactant may have a structure in which an alkyl and a halogen element are combined. In such an embodiment, the alkyl may be an acyclic alkyl, a primary alcohol, a secondary alcohol, a tertiary alcohol, an alkylamine, a p-substituted amyline, phenyl ammonium, ammonium fluoride, or the like, and the halogen element may be Cl, Br, I or the like.

Figure 9:
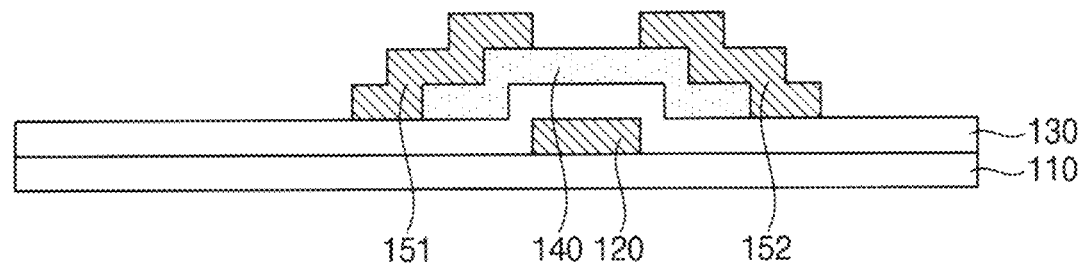

Referring to FIG. 9, the source electrode 151 and the drain electrode 152 may be provided or formed on the active layer 140. The source electrode 151 and the drain electrode 152 may be formed by completely forming a metal layer on the insulating layer 130 to cover the active layer 140 and then patterning the metal layer through a mask.

Figure 10:
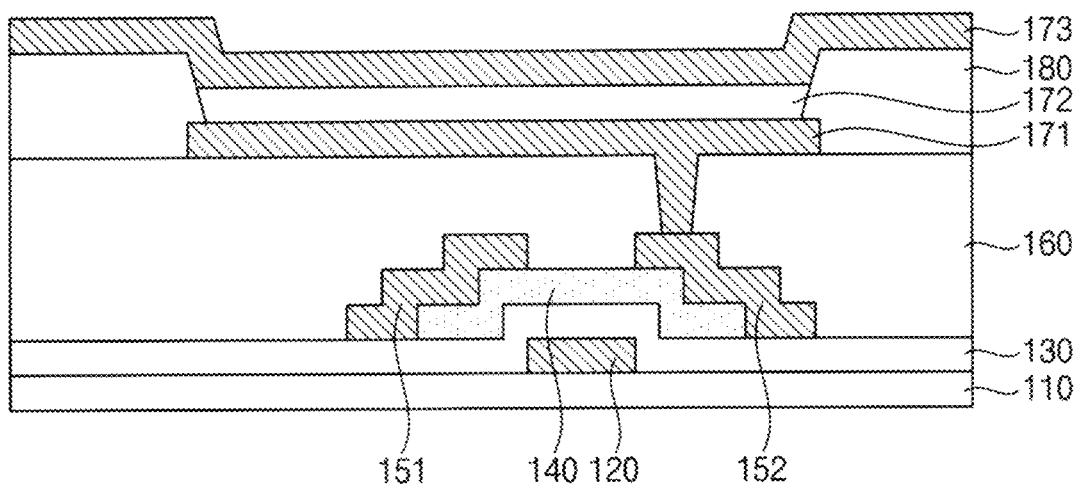

Referring to FIG. 10, the via insulating layer 160 may be provided or formed on the insulating layer 130 to cover the source electrode 151 and the drain electrode 152. In such an embodiment, the first electrode 171 may be provided or formed on the via insulating layer 160, and the pixel defining layer 180 may be provided or formed on the via insulating layer 160. The emission layer 172 may be provided or formed on the first electrode 171, and the second electrode 173 may be provided or formed on the emission layer 172.

FIG. 11A to FIG. 11I are diagrams illustrating an analysis of a perovskite compound included in the thin film transistor of FIG. 1.

Figure 11A:
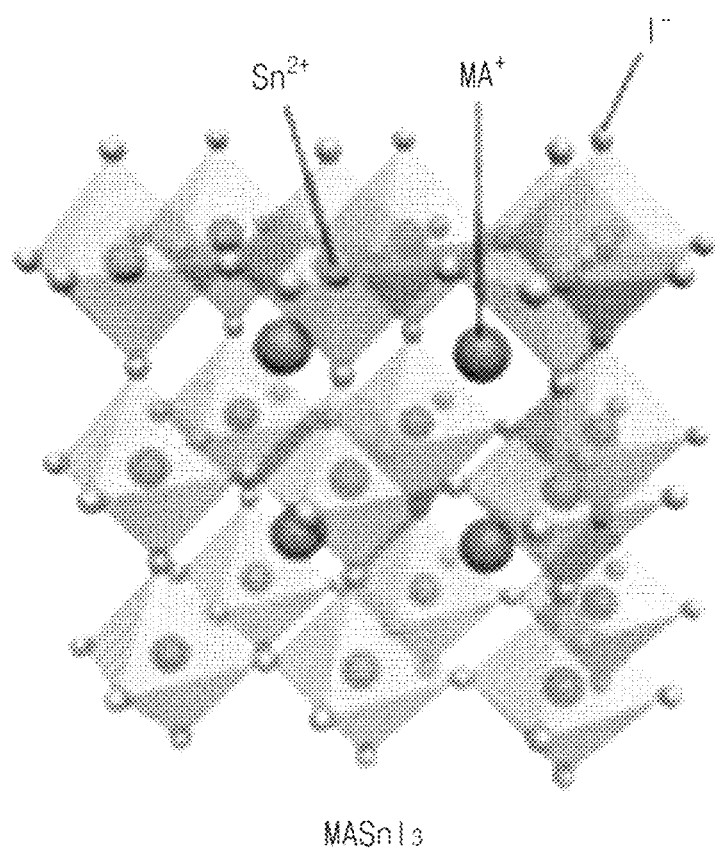
FIG. 11A to FIG. 11I are diagrams illustrating an analysis of a perovskite compound included in the thin film transistor of FIG. 1.
Figure 11B:
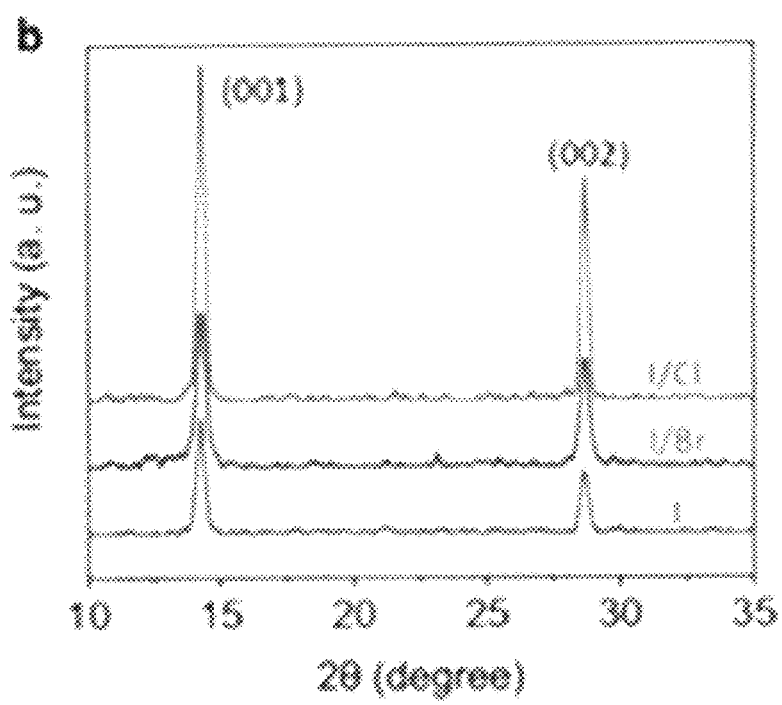

Referring to FIGS. 11A and 11B, FIG. 11A is a diagram illustrating the crystal structure of the perovskite compound, and FIG. 11B is a graph performed by X-Ray Diffraction ("XRD") analysis on the perovskite compound. As shown in FIG. 11B, peaks shown in (001) and (002) indicate that the perovskite compound used for the analysis is formed with $MASn_{0.94}Pb_{0.06}I_3$ film, $MASn_{0.94}Pb_{0.06}(I_{0.98}Br_{0.02})_3$ film, and $MASn_{0.94}Pb_{0.06}(I_{0.94}Cl_{0.06})_3$ film. By adding Br or Cl to the $MASnI_3$-based perovskite compound, crystallization of the perovskite compound is improved.

Figure 11C:
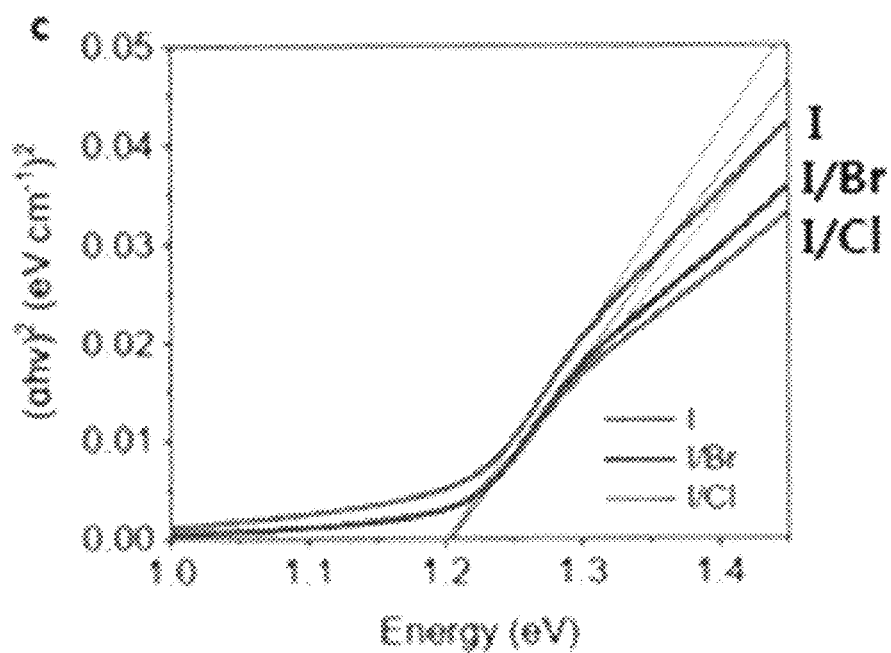

Referring to FIG. 11C, FIG. 11C shows an energy band gap ("Eg") of the perovskite compound measured using a Tauc plot. As shown in FIG. 11c, the Eg values of the three films are similar to the Eg value of the $MASn_{0.94}Pb_{0.06}(I_{0.98}Br_{0.02})_3$ film. In a case where Br was added, the Eg value slightly increased due to an upper shift of conduction band of the I/Br system. In a case where Cl was added, the Eg value increased negligibly.

Figure 11D:
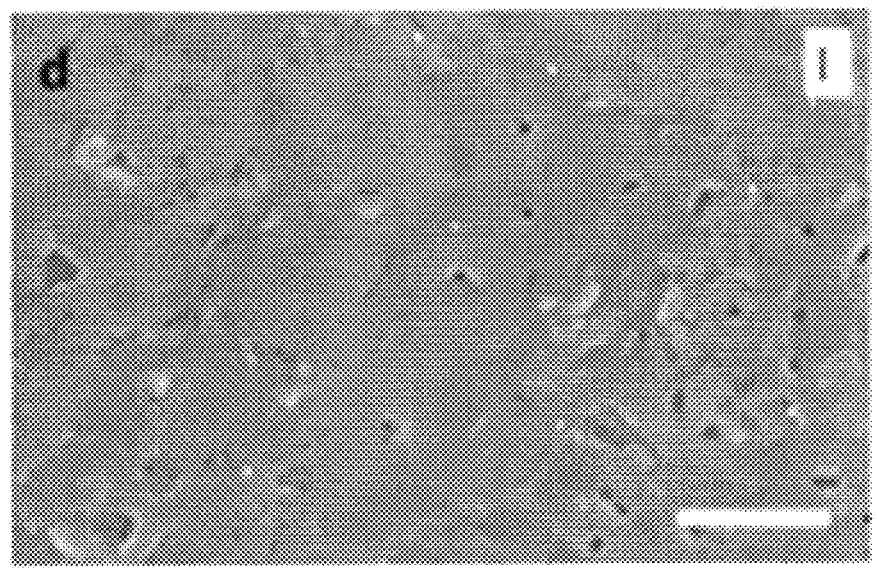
Figure 11E:
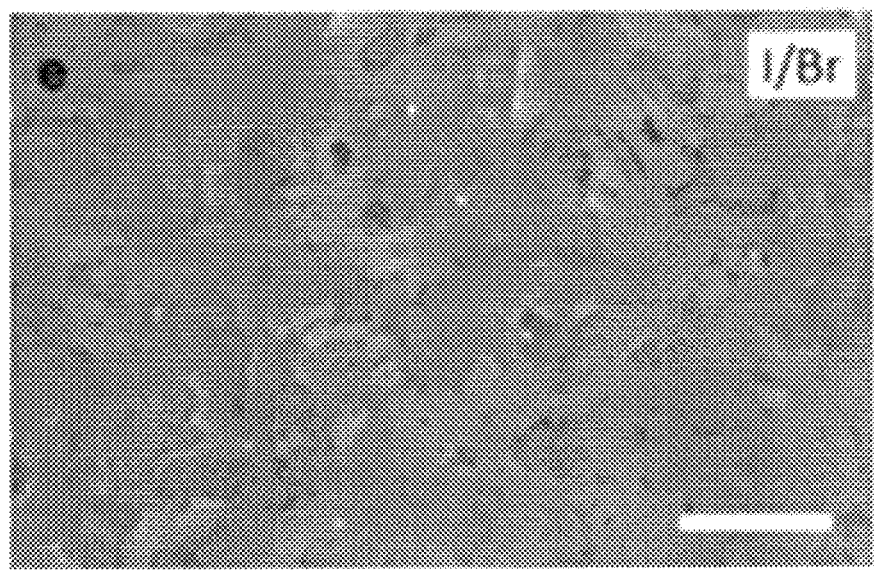
Figure 11F:
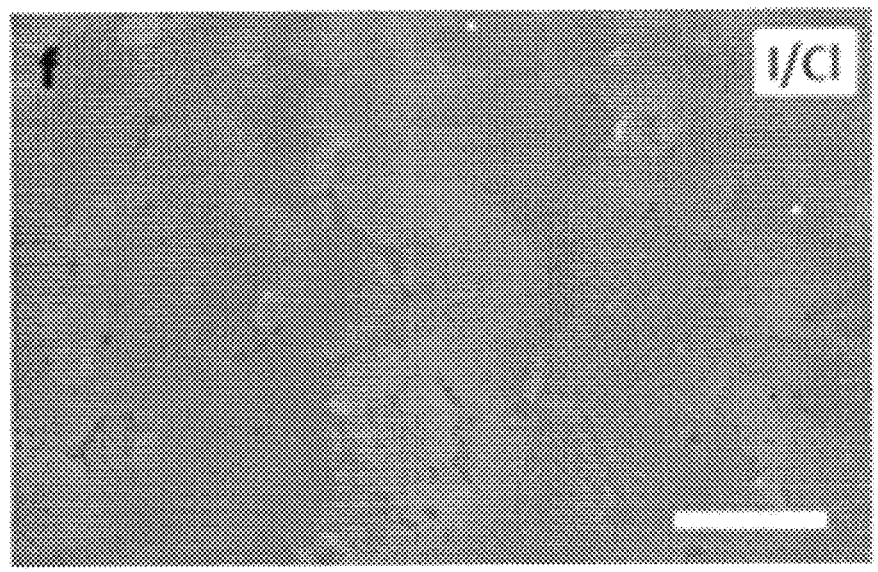

Referring to FIGS. 11D to 11F, FIG. 11D shows a scanning electron microscope ("SEM") image of a $MASn_{0.94}Pb_{0.06}I_3$ film, FIG. 11E shows an SEM image of a $MASn_{0.94}Pb_{0.06}(I_{0.98}Br_{0.02})_3$ film, and FIG. 11F shows an SEM image of an $MASn_{0.94}Pb_{0.06}(I_{0.94}Cl_{0.06})_3$ film. As shown in FIG. 11D, several pinholes were observed in the $MASn_{0.94}Pb_{0.06}I_3$ film. As shown in FIG. 11E, pinholes were reduced in the $MASn_{0.94}Pb_{0.06}(I_{0.98}Br_{0.02})_3$ film. As shown in FIG. 11F, the $MASn_{0.94}Pb_{0.06}(I_{0.94}Cl_{0.06})_3$ film had full coverage and large grain size, and exhibited high or improved film quality.

Figure 11G:
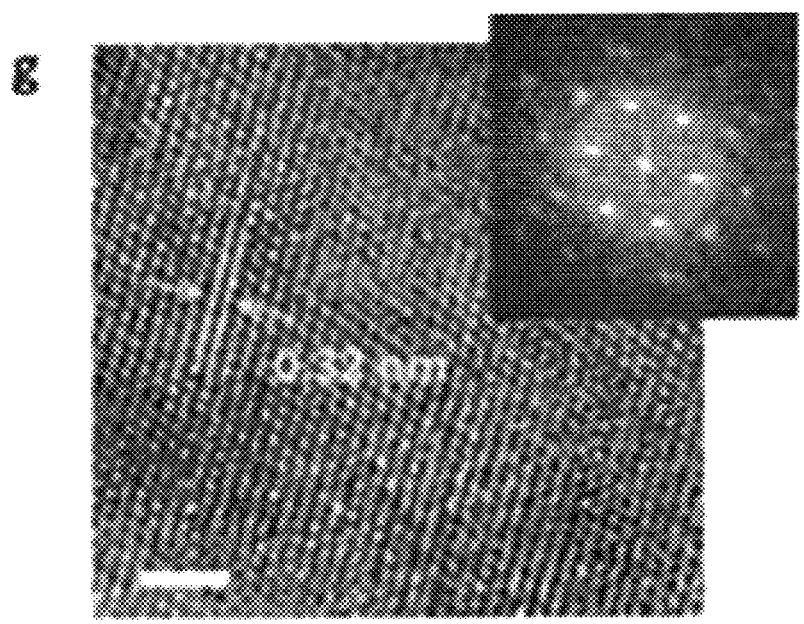
Figure 11H:
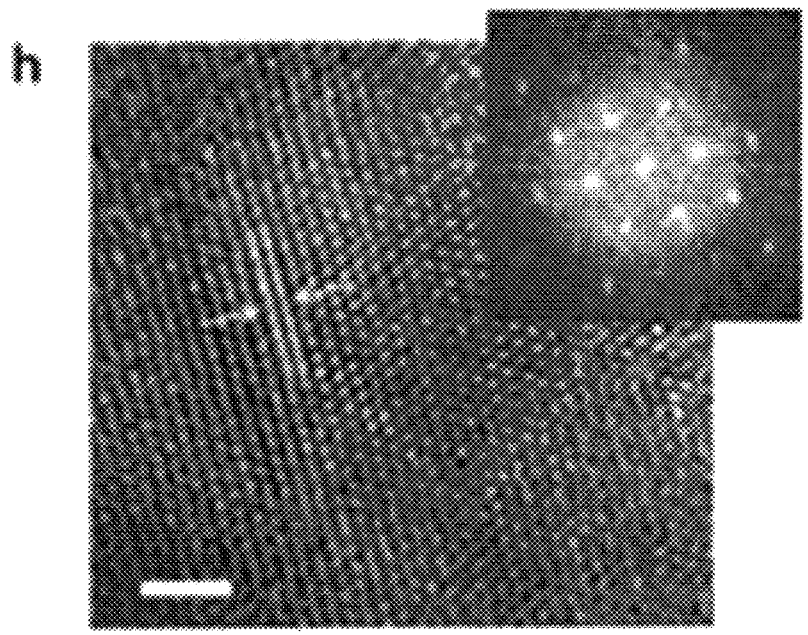
Figure 11I:
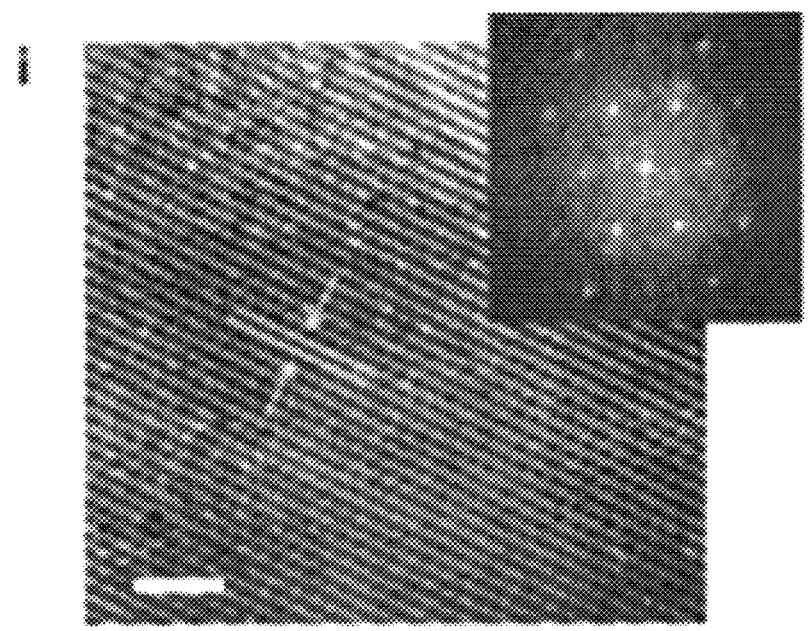

Referring to FIGS. 11G to 11I, FIG. 11G shows a transmission electron microscopy ("TEM") image and fast Fourier transform ("FFT") pattern of the $MASn_{0.94}Pb_{0.06}I_3$ film, FIG. 11H shows a TEM image and FFT pattern of the $MASn_{0.94}Pb_{0.06}(I_{0.98}Br_{0.02})_3$ film, FIG. 11I shows a TEM image and FFT pattern of a $MASn_{0.94}Pb_{0.06}(I_{0.94}Cl_{0.06})_3$ film. As shown in FIGS. 11G to 11I, a highly crystalline perovskite structure with a characteristic lattice spacing of 0.32 nm was formed in all films.

Figure 12A:
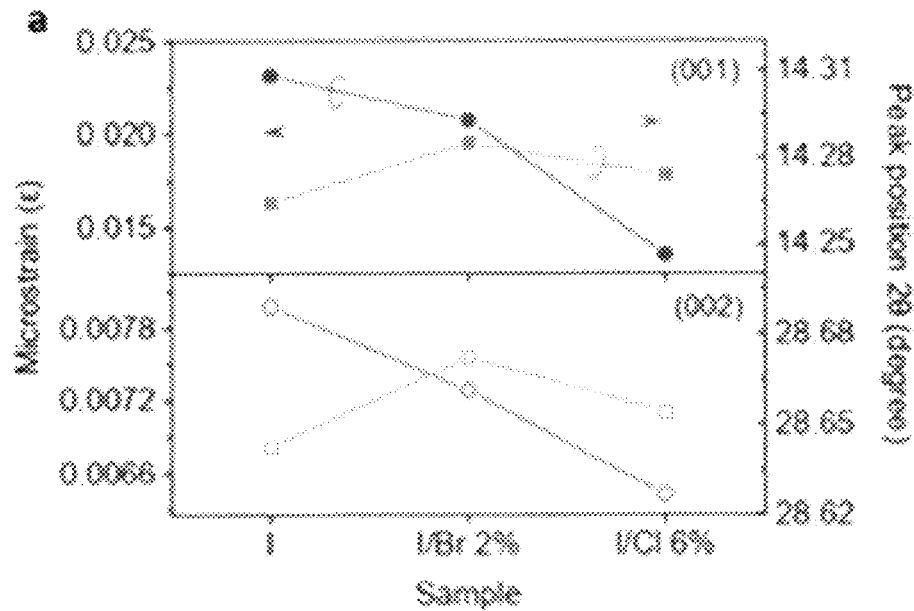
FIG. 12A to FIG. 12C are diagrams illustrating a perovskite compound included in the thin film transistor of FIG. 1.
Figure 12B:
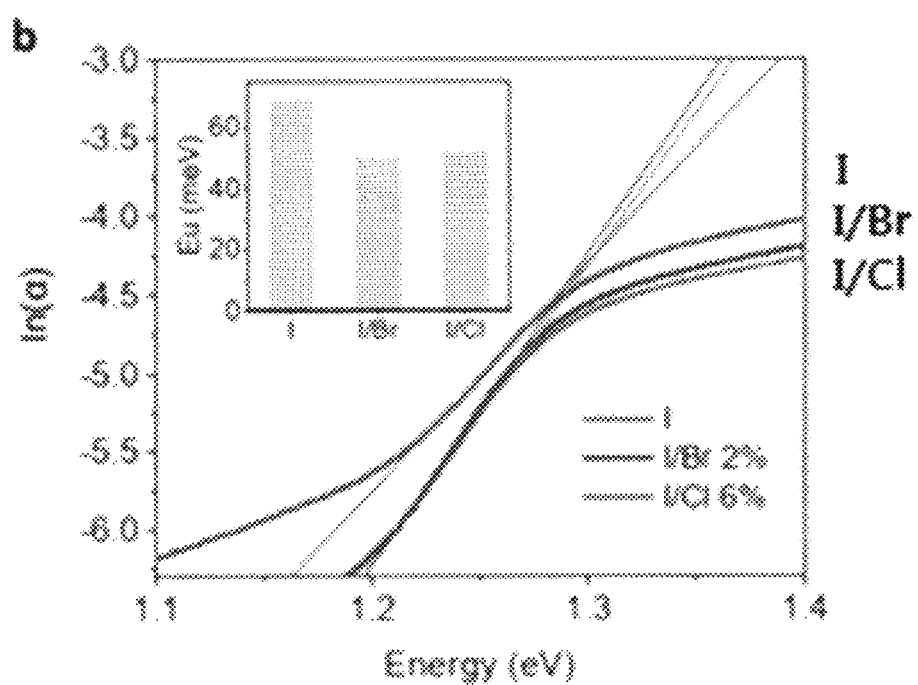
Figure 12C:
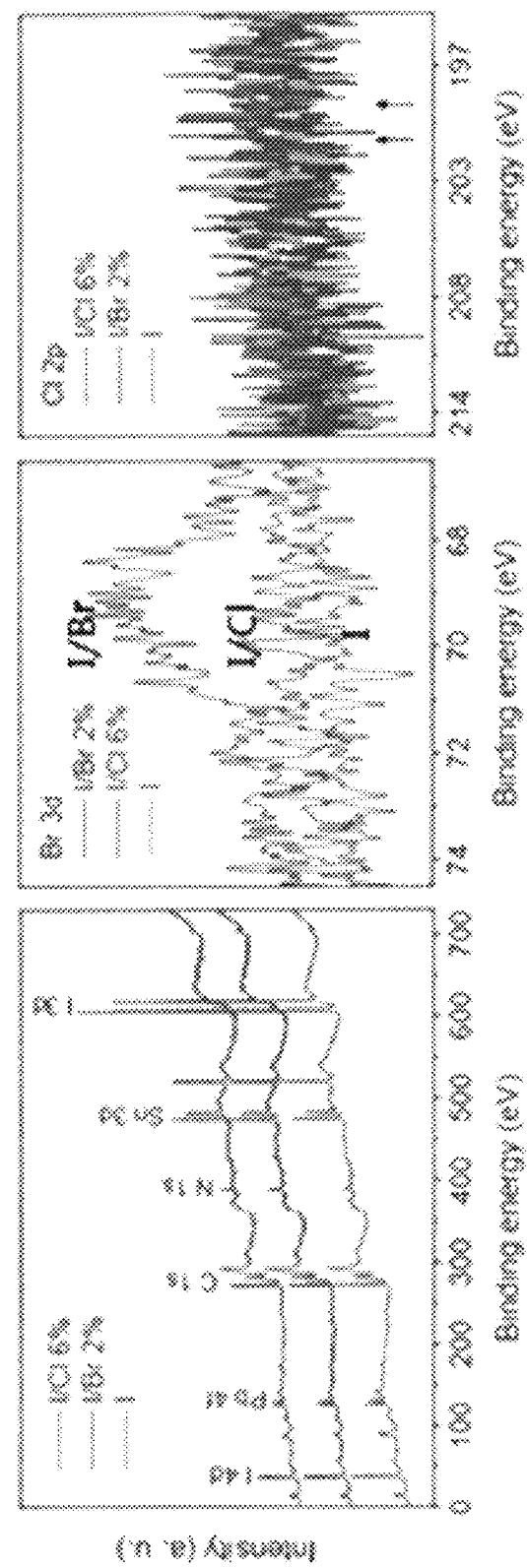

FIG. 12A to FIG. 12C are diagrams illustrating a perovskite compound included in the thin film transistor of FIG. 1. Particularly, FIGS. 12A to 12C are diagrams showing the reason why the characteristics of a thin film transistor including the perovskite compound to which Br or Cl is added improved.

Referring to FIG. 12A, FIG. 12A is a graph showing the amount of change in lattice strain of the $MASn_{0.94}Pb_{0.06}I_3$ film, the $MASn_{0.94}Pb_{0.06}(I_{0.98}Br_{0.02})_3$ film, and the $MASn_{0.94}Pb_{0.06}(I_{0.94}Cl_{0.06})_3$ using a Williamson-Hall plot from the XRD analysis data of FIG. 11B. As shown in FIG. 12A, in a case where Br or Cl is added to the perovskite compound, the defect centers or traps that trap charge carriers and adversely affect the properties of the thin film transistor are minimized, and thus the microstrain of the lattice is reduced. Particularly, in a case where Br was added, the microstrain was decreased, and in a case where Cl was added, the smallest microstrain was shown at the (001) and (002) peaks.

Referring to FIG. 12B, FIG. 12B is a graph showing Urbach energy ("Eu") values of the films. As the Eu value decreases, the structural quality of the film for charge transfer increases. In a case where no additive was added, the Eu value of the $MASn_{0.94}Pb_{0.06}I_3$ film was about 68.6 milli-electron volt (meV). In a case where Br was added, the Eu value of the $MASn_{0.94}Pb_{0.06}(I_{0.98}Br_{0.02})_3$ film decreased to about 50.2 meV. In a case where Cl was added, the Eu value of the $MASn_{0.94}Pb_{0.06}(I_{0.94}Cl_{0.06})_3$ film decreased to about 52.8 meV. Accordingly, in a case where Br or Cl is added, the Eu value is decreased compared to the case where Br or Cl is not added, and the structural quality showing higher charge transfer properties of the film is improved.

Referring to FIG. 12C, FIG. 12C shows graphs illustrating an X-ray photoelectron spectroscopy ("XPS") radiation spectrum, a Br 3d core level spectrum, and a Cl 2p core level spectrum. As shown in FIG. 12C, Br and Cl function in different ways. In detail, referring to the XPS irradiation spectrum, the films are composed of a perovskite compound based on $MASn_{0.94}Pb_{0.06}I_x$. Referring to the Br 3d core spectrum, the signal of Br 3d was easily detected. On the other hand, referring to the Cl 2p core spectrum, the signal of Cl 2p was not detected. When 6 mol % of chloride is added to the precursor but there is no signal detected in the film, it is determined that the chloride is released in the form of a gas according to Scheme 1 below during the formation of the film.

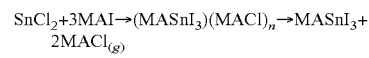

$$SnCl_2 + 3MAI \rightarrow (MASnI_3)(MACl)_n \rightarrow MASnI_3 + 2MACl_{(g)}$$ [Scheme 1]

Table 1 below is a table showing characteristics of the thin film transistor including the perovskite compound.

TABLE 1

| Perovskite compound | Charge mobility $(cm^2 V^{-1} S^{-1})$ | Current on/off ratio | subthreshold swing | hysteresis (V) |
|---|---|---|---|---|
| $MASn_{0.94}Pb_{0.06}I_3$ | 1.2 | $1.20 \times 10^6$ | 0.51 | 1.54 |
| $MASn_{0.94}Pb_{0.06}(I_{0.98}Br_{0.02})_3$ | 4.5 | $1.37 \times 10^6$ | 0.57 | 0.98 |
| $MASn_{0.94}Pb_{0.06}(I_{0.94}Cl_{0.06})_3$ | 9.2 | $1.03 \times 10^7$ | 0.24 | 1.60 |

Referring to Table 1 above, in a case where Br or Cl is added to the perovskite compound, charge mobility and current on/off ratio of the thin film transistor are improved, and hysteresis is maintained or reduced.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A thin film transistor comprising:
a gate electrode;
an insulating layer disposed on the gate electrode; and
an active layer disposed on the insulating layer, wherein the active layer comprises a perovskite compound represented by the following Formula:

$$AB_{(1-u)}C_{(u)}[X_{(1-v)}Y_{(v)}]_3,$$

wherein
A is a monovalent organic cation, a monovalent inorganic cation, or any combination thereof,
B is $Sn^{2+}$,
C is a divalent cation or trivalent cation selected from the group consisting of $La^{2+}$, $Ce^{2+}$, $Pr^{2+}$, $Nd^{2+}$, $Pm^{2+}$, $Eu^{2+}$, $Gd^{2+}$, $Tb^{2+}$, $Ho^{2+}$, $Er^{2+}$, $Tm^{2+}$, $Yb^{2+}$, $Lu^{2+}$, $Be^{2+}$, $Mg^{2+}$, $Ca^{2+}$, $Sr^{2+}$, $Ba^{2+}$, $Ra^{2+}$, $Pb^{2+}$, $Sn^{2+}$, $Pb^{2+}$, $Sn^{2+}$, $Sb^{3+}$, $Al^{3+}$, $Ga^{3+}$, $Bi^{3+}$, or a combination thereof,
X is a monovalent anion,
Y is a monovalent anion different from X,
u is a real number greater than 0 and less than 1, and
v is a real number greater than 0 and less than 0.08.

2. The thin film transistor of claim 1, wherein X and Y are independent of each other and are each selected from the group consisting of $I^-$, $Cl^-$, $Br^-$, and $SCN^-$.

3. The thin film transistor of claim 2, wherein X is $I^-$, and wherein Y is selected from the group consisting of $Cl^-$, $Br^-$, and $SCN^-$.

4. The thin film transistor of claim 1, wherein C is selected from the group consisting of $Pb^{2+}$, $In^{3+}$, and $Sb^{3+}$.

5. The thin film transistor of claim 1, wherein A is a methylammonium cation ($MA^+$).

6. The thin film transistor of claim 1, wherein the insulating layer comprises hafnium oxide ($HfO_2$).

7. A method for manufacturing a thin film transistor, the method comprising:
preparing an active solution comprising a perovskite compound represented by the following Formula: $AB_{(1-u)}C_{(u)}[X_{(1-v)}Y_{(v)}]_3$, by mixing a precursor comprising a solvent, AX, and $BY_2$;
preparing a substrate on which a gate electrode is provided;
providing an insulating layer on the substrate to cover the gate electrode; and
providing an active layer on the insulating layer using the active solution, wherein
A is a monovalent organic cation, a monovalent inorganic cation, or any combination thereof,
B is $Sn^{2+}$,
C is a divalent cation or trivalent cation selected from the group consisting of $La^{2+}$, $Ce^{2+}$, $Pr^{2+}$, $Nd^{2+}$, $Pm^{2+}$, $Eu^{2+}$, $Gd^{2+}$, $Tb^{2+}$, $Ho^{2+}$, $Er^{2+}$, $Tm^{2+}$, $Yb^{2+}$, $Lu^{2+}$, $Be^{2+}$, $Mg^{2+}$, $Ca^{2+}$, $Sr^{2+}$, $Ba^{2+}$, $Ra^{2+}$, $Pb^{2+}$, $Sn^{2+}$, $Pb^{2+}$, $Sn^{2+}$, $Sb^{3+}$, $Al^{3+}$, $Ga^{3+}$, $Bi^{3+}$, or a combination thereof,
X is a monovalent anion, Y is a monovalent anion different from X,
u is a real number greater than 0 and less than 1, and
v is a real number greater than 0 and less than 0.08.

8. The method of claim 7, wherein the providing the active layer comprises using a spin coating process.

9. The method of claim 8, wherein the spin coating process is performed at about 3000 rpm for about 30 seconds.

10. The method of claim 7, wherein
the providing the active layer comprises using a thermal evaporation process, and
wherein the thermal evaporation process is performed by heating the precursor from different sources.

11. The method of claim 7, wherein the providing the insulating layer comprises using an atomic layer deposition process.

12. The method of claim 11, further comprising:
performing a plasma treatment or an ultraviolet ozone treatment on the insulating layer,
after performing the atomic layer deposition process.

13. A display device comprising:
a substrate;
a thin film transistor disposed on the substrate; and
an emitting diode disposed on the thin film transistor and electrically connected to the thin film transistor,
wherein the thin film transistor comprises:
a gate electrode;
an insulating layer disposed on the gate electrode; and
an active layer disposed on the insulating layer, wherein the active layer comprises a perovskite compound represented by the following Formula:

$$AB_{(1-u)}C_{(u)}[X_{(1-v)}Y_{(v)}]_3$$

wherein
A is a monovalent organic cation, a monovalent inorganic cation, or any combination thereof,
B is $Sn^{2+}$,
C is a divalent cation or trivalent cation selected from the group consisting of $La^{2+}$, $Ce^{2+}$, $Pr^{2+}$, $Nd^{2+}$, $Pm^{2+}$, $Eu^{2+}$, $Gd^{2+}$, $Tb^{2+}$, $Ho^{2+}$, $Er^{2+}$, $Tm^{2+}$, $Yb^{2+}$, $Lu^{2+}$, $Be^{2+}$, $Mg^{2+}$, $Ca^{2+}$, $Sr^{2+}$, $Ba^{2+}$, $Ra^{2+}$, $Pb^{2+}$, $Sn^{2+}$, $Pb^{2+}$, $Sn^{2+}$, $Sb^{3+}$, $Al^{3+}$, $Ga^{3+}$, $Bi^{3+}$, or a combination thereof,
X is a monovalent anion,
Y is a monovalent anion different from X,
u is a real number greater than 0 and less than 1, and
v is a real number greater than 0 and less than 0.08.

14. The display device of claim 13, wherein X and Y are independent of each other and are each selected from the group consisting of $I^-$, $Cl^-$, $Br^-$, and $SCN^-$.

15. The display device of claim 13, wherein C is selected from the group consisting of $Pb^{2+}$, $In^{3+}$, and $Sb^{3+}$.

16. The display device of claim 13, wherein A is a methylammonium cation ($MA^+$).

* * * * *